(12) United States Patent
Gariboldi

(10) Patent No.: US 9,935,626 B2
(45) Date of Patent: Apr. 3, 2018

(54) DRIVER FOR A POWER FIELD-EFFECT TRANSISTOR, RELATED SYSTEM AND INTEGRATED CIRCUIT

(71) Applicant: STMicroelectronics S.R.L., Agrate Brianza (IT)

(72) Inventor: Aldo Davide Gariboldi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/195,122

(22) Filed: Jun. 28, 2016

(65) Prior Publication Data

US 2017/0222638 A1    Aug. 3, 2017

(30) Foreign Application Priority Data

Jan. 29, 2016  (IT) .......................... 102016000009376

(51) Int. Cl.
| | |
|---|---|
| *H03K 17/14* | (2006.01) |
| *G05F 3/16* | (2006.01) |
| *H03K 17/042* | (2006.01) |
| *H03K 17/16* | (2006.01) |

(52) U.S. Cl.
CPC ............ *H03K 17/145* (2013.01); *G05F 3/16* (2013.01); *H03K 17/04206* (2013.01); *H03K 17/164* (2013.01); *H03K 17/167* (2013.01)

(58) Field of Classification Search
CPC .................................................... H03K 17/145
See application file for complete search history.

(56) References Cited

U.S. PATENT DOCUMENTS

| | | | |
|---|---|---|---|
| 5,289,051 A | 2/1994 | Zitta | |
| 5,396,412 A | 3/1995 | Barlage | |
| 6,061,255 A | 5/2000 | Chik et al. | |
| 6,111,769 A | 8/2000 | Zhang et al. | |
| 6,297,970 B2 | 10/2001 | Hemena et al. | |
| 7,161,813 B2 | 1/2007 | Librizzi et al. | |
| 7,378,878 B2 * | 5/2008 | Major ................. | H03K 17/163 326/26 |
| 2009/0002054 A1 | 1/2009 | Tsunoda et al. | |
| 2009/0175056 A1 | 7/2009 | Choi | |
| 2011/0241738 A1 | 10/2011 | Tamaoka | |

* cited by examiner

*Primary Examiner* — Daniel Puentes
(74) *Attorney, Agent, or Firm* — Seed IP Law Group LLP

(57) ABSTRACT

A driver for a power field-effect transistor includes a first and second circuits that apply respective charge currents to a gate of the power field-effect transistor when a control signal has a first logic value and the voltage between the gate and the source is smaller than a first threshold voltage and greater than a second threshold voltage. Third and fourth circuits apply respective discharge currents to the gate when the control signal has a second logic value and the voltage between the gate and the source is greater than a third threshold voltage and smaller than a fourth threshold voltage. The driver may include at least one field-effect transistor configured to generate at least one of the first, second, third or fourth threshold voltage.

21 Claims, 10 Drawing Sheets

DRIVER FOR A POWER FIELD-EFFECT TRANSISTOR, RELATED SYSTEM AND INTEGRATED CIRCUIT

BACKGROUND

Technical Field

Embodiments of the present disclosure relate to techniques for driving a Field-Effect Transistor (FET).

Description of the Related Art

FIG. 1 shows a typical half-bridge arrangement 20 comprising two electronic switches $SW_1$ and $SW_2$, such as n-channel power MOSFETs (Metal-Oxide-Semiconductor Field-Effect Transistor), connected in series between a supply voltage Vdd and a ground GND.

Usually, the switches $SW_1$ and $SW_2$ are closed alternatively in order to connect the output OUT of the half-bridge arrangement 20, i.e., the intermediate point between the switches $SW_1$ and $SW_2$, either to the voltage Vdd or to ground GND.

For this purpose, the half-bridge is driven as a function of two drive signals $DRV_1$ and $DRV_2$, which are connected (e.g., directly) to the control gates of the switches $SW_1$ and $SW_2$, respectively.

Specifically, in order to correctly drive the control gates, usually a high-side driver $200_1$ is used to generate the drive signal $DRV_1$ for the high-side switch $SW_1$ as a function of a first control signal $IN_1$, and a low-side driver $200_2$ is used to generate the drive signal $DRV_2$ for the low-side switch $SW_2$ as a function of a control signal $IN_2$.

The control signal $IN_2$ corresponds often to an inverted version of the signal $IN_1$ (or vice versa), i.e., the signal $IN_2$ is low when the signal $IN_1$ is high and vice versa. For example, in FIG. 1 is used an inverter 202 which receives at input the signal $IN_1$ and provides at output the signal $IN_2$.

The output OUT of the half-bridge arrangement 20 may be used to drive a load. For example, in FIG. 1, the half-bridge arrangement 20 drives a motor $M_1$ connected between the output OUT of the half-bridge arrangement 20 and ground GND.

Conversely, FIG. 2 shows an example in which two half-bridge arrangements $20_a$ and $20_b$ are used to drive a linear motor $M_2$, such as a voice coil motor, connected between the output $OUT_a$ of the first bridge arrangement $20_a$ and the output $OUT_b$ of the second bridge arrangement $20_b$. As well known to those of skill in the art, in this case, also the rotation direction of the motor $M_2$ may be controlled by applying appropriate control signals $IN_a$ and $IN_b$ to the half-bridge arrangements $20_a$ and $20_b$.

Finally, FIG. 3 shows an example in which three half-bridge arrangements $20_a$, $20_b$ and $20_c$ are used to drive a three phase motor $M_3$, such as a spindle motor, connected between the outputs $OUT_a$, $OUT_b$ and $OUT_c$ of the half-bridge arrangements $20_a$, $20_b$ and $20_c$.

For example, typically the control signals $IN_1$ and $IN_2$ correspond to pulse width modulated (PWM) signals, i.e., signals with a fixed frequency and a variably duty cycle.

Accordingly, in the examples considered, the actuation of a load, in particular inductive loads (such as motors), requires at least one half-bridge arrangement 20 able to reproduce the profile of at least one input signal IN at the terminals of the load.

However, there are limitations for the implementation of the half-bridge arrangement 20 and in particular the drivers $200_1$ and $200_2$ that should be taken into account.

A first problem may arise in case both switches $SW_1$ and $SW_2$ are switched on (i.e., conductive) at the same time. This condition is known as cross conduction and should be avoided, because it may be destructive for the switches $SW_1$ and $SW_2$. In order to avoid this problem, dead times may be introduced, in which both power MOSFETs $SW_1$ and $SW_2$ are switched off. However, such dead times may result in a degradation of the voltage profile both in terms of distortions and efficiency.

A second problem may relate to EMI (Electromagnetic interference) emissions during the commutation edges. The EMI emission can be reduced by controlling the slope of the edges. Both the controlled slope and dead times contribute to define a minimum width of the PWM input signal that can be actuated without distortions.

Accordingly, the optimization of power MOSFET driving requires performing a specific control of the gates during the switch-on and switch-off process.

FIG. 4 shows a qualitative representation of the gate-source charge curve $V_{GS}$ in relation to charge applied to the gate of a power MOSFET.

When the power MOSFET has to be turned on, the respective driver 200 should quickly charge the gate to pass a first region R1, usually called sub threshold region.

In a second region R2, usually called saturation region or Miller plateau, the current/charge injected into the gate does not increase significantly the gate voltage and the quantity of current/charge injected may be used to define the slope of the switching node edge. Accordingly, during this phase, the current may be controlled in order to reduce the generation of EMI interferences.

The following third region R3, usually called linear region, represents a transition region until the minimum switch-on resistance $R_{on}$ condition is reached.

In the case of power MOSFETs, it is preferably to have a sequential control to correctly manage the different regions R1-R3.

Prior-art MOSFET control is usually performed in two possible ways: open loop or closed loop.

The open loop control is often based on the usage of circuits that introduce delays to take into account the duration of the corresponding phases required to pass the various regions R1-R3. In fact, as shown in FIG. 4, in case of known charge currents with a constant value at least during each of the drive phases over the regions R1-R3, the boundaries between the regions R1/R2 and R2/R3 correspond approximately to determined time instants $t_1$ and $t_2$.

For example, in FIG. 5, each control signal $IN_1/IN_2$ is fed both to the driver $200_1/200_2$ and to a delay chain, comprising for example two delay lines 204, in order to generate further control signals able to detect when a given phase has ended.

This approach has a simple implementation, but a drawback relates to the fact that process and temperature variations have to be taken into account to set the proper delay timing. Accordingly, margins should be taken into account in order to satisfy different conditions resulting in a reduced efficiency.

A second method for the gate control relies on a closed loop control.

As shown in FIG. 6, the closed loop control may be based on a detection of the turn on/off regions of the power MOSFETs by monitoring the gate voltage of the power MOSFET, e.g., by means of two comparators 206 configured to compare the gate-source voltage $V_{GS}$ of the respective power MOSFET with threshold values $V_{refL}$ and $V_{refH}$.

As shown in FIG. 4, there exists usually a correspondence between the gate-source voltage ranges and the different turn on/off regions R1-R3, and the information at the output of comparators 206 can thus be used as a feedback to control dedicated circuits for each specific phase.

Moreover, thanks to the closed loop nature, this implementation is able to adapt the control to process and temperature variations. Nevertheless, a drawback relates to the commutation delays of the comparators 206 that influence the effective duration of the phases, thereby limiting the bandwidth of the control loop.

BRIEF SUMMARY

In view of the above, embodiments of the present disclosure provide solutions which overcome one or more of the above drawbacks.

For example, embodiments of the present disclosure provide an automatic, fast, process and/or temperature independent strategy able to optimize the control of the different turn on/off phases, overcoming the limits of prior-art implementations. Such an optimized control may be able to increase the efficiency by reducing dead times that are usually present to avoid cross-conduction of the half bridge.

Further embodiments of the present disclosure relate to an improved symmetry of the edges of the output node of the half bridge, thereby decreasing the distortions introduced by the drivers on the PWM profile.

One or more embodiments are directed to a driver for a power field-effect transistor and a related system and integrated circuit.

The claims are an integral part of the technical teaching of the disclosure provided herein.

As mentioned in the foregoing, the present disclosure relates to a driver for a power field-effect transistor (FET), such as a power MOSFET.

In various embodiments, the driver comprises an input terminal for receiving a control signal, such as the control signal IN mentioned in the foregoing, and a first and a second output terminal to be connected to the gate and the source of the power FET, respectively.

In various embodiments, the driver comprises various sub-circuits which drive the various turn-on and turn-off phases of the power FET.

For example, in various embodiments, the driver comprises a first circuit configured to apply a charge current to the first output terminal when the control signal has a first logic value, e.g., high, and the output voltage, i.e., the voltage between the first and the second output terminals, is smaller than a first threshold voltage.

In various embodiments, the driver may comprise a second circuit configured to apply a charge current to the first output terminal when the control signal has the first logic value and the output voltage is greater than a second threshold voltage, which is higher than the first threshold voltage.

In various embodiments, the driver may comprise a third circuit configured to apply a discharge current to the first output terminal when the control signal has a second logic value, e.g., low, and the output voltage is greater than a third threshold voltage, which may correspond to the second threshold voltage.

In various embodiments, the driver may comprise a fourth circuit configured to apply a discharge current to the first output terminal when the control signal has the second logic value and the output voltage is smaller than a fourth threshold voltage, which generally is smaller than the third threshold voltage and which may correspond to the first threshold voltage.

In various embodiments, the driver comprises at least one field-effect transistor configured to generate at least one of the first, second, third or fourth threshold voltage.

For example, in various embodiments, the first circuit comprises a bias current source configured to generate a bias current and a FET connected in series with the bias current source. Specifically, the gate of the FET is connected to the drain of the FET, such that the drain-source voltage of the FET corresponds to the threshold voltage of the FET representing the first threshold voltage. In this case, the first circuit may comprise a voltage follower arrangement configured to apply a charge current to the first output terminal until the output voltage reaches the first threshold voltage. The first circuit may comprise a first electronic switch configured to selectively enable the first circuit when the control signal has the first logic value.

In various embodiments, the second circuit comprises also a bias current source configured to generate a second bias current and two FETs connected in series with the bias current source. Specifically, the gate of the first FET is connected to the drain of the first FET, such that the drain-source voltage of the first FET corresponds to the threshold voltage of the first FET. Conversely, the gate of the second FET is connected to the first output terminal, such that the first and second FETs are closed when the output voltage is greater than the sum of the threshold voltages of the first and second FET. Accordingly, this sum of threshold voltages represents the second threshold voltage. In various embodiments the second circuit may further comprise an electronic switch configured to connect the output to a supply voltage when the two FETS are closed, i.e., when the output voltage is greater than the sum of the threshold voltages of the first and second FET. In various embodiments, the second circuit may comprise a further electronic switch configured to selectively enable the second circuit when the control signal has the first logic value.

In various embodiments, the third circuit comprises two FETs connected in series between the output terminals. Specifically, at least one electronic switch is associated with these first and/or the second FETs, such that, when the control signal has the second logic value:

a) the gate of the first FET is connected to the own drain, such that the drain-source voltage of first FET corresponds to the threshold voltage of the FET, b) the gate of the second FET is connected to the own drain, such that the drain-source voltage of the second FET corresponds to the threshold voltage of the FET, and c) both FETs are closed when the output voltage is greater than the sum of the threshold voltages of the two FETs.

Accordingly, the sum of the threshold voltages of these two FETs represents the third threshold voltage.

In various embodiments, the various FETs have the same characteristics, e.g., the same dimensions. Specifically, in various embodiments, the FETs are scaled versions of the power FET, i.e., FETs with reduced dimension with respect to the power FET. For example, this may be obtained by producing the FETs of the driver (and possibly the power FET) with the same process and/or within the same integrated circuit.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not limit the scope or meaning of the embodiments.

In the following FIGS. 7 to 17, parts, elements or components which have already been described with reference to FIGS. 1 to 6 are denoted by the same references previously used in such Figures. The description of such previously described elements will not be repeated in the following in order not to overburden the present detailed description.

Figure 1:
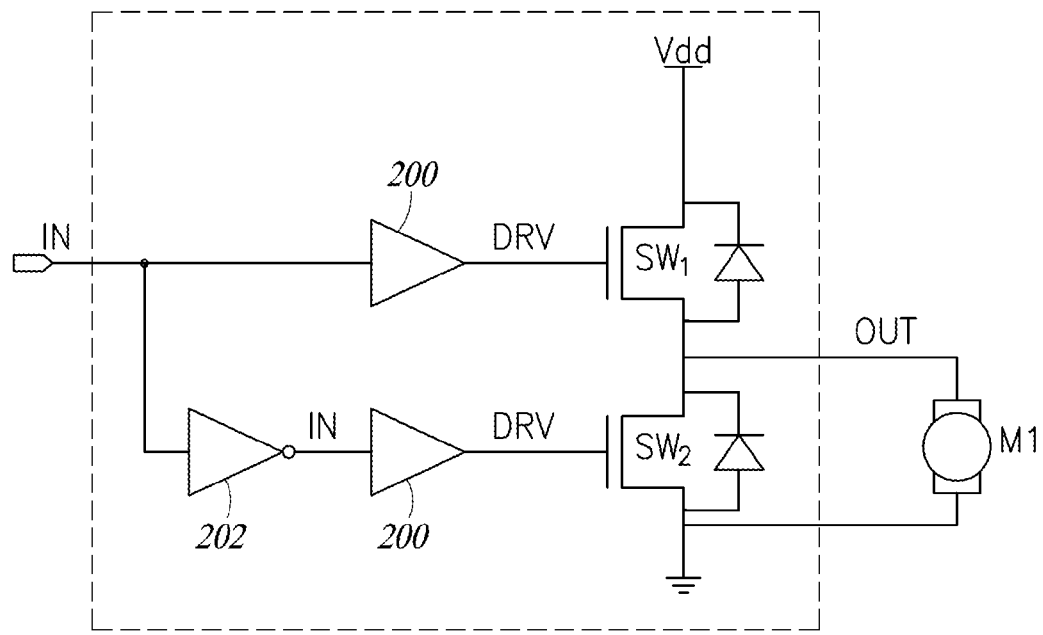
FIGS. 1, 2 and 3 shows examples of typical half-bridge arrangements.
Figure 2:
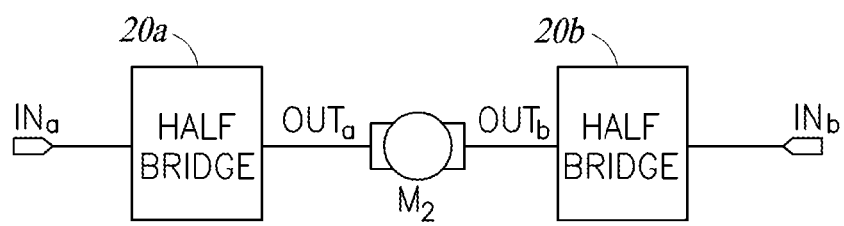
Figure 3:
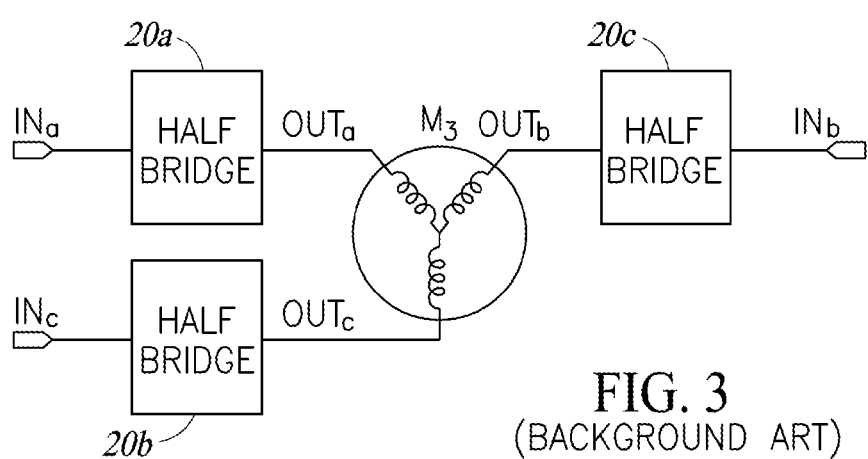
Figure 4:
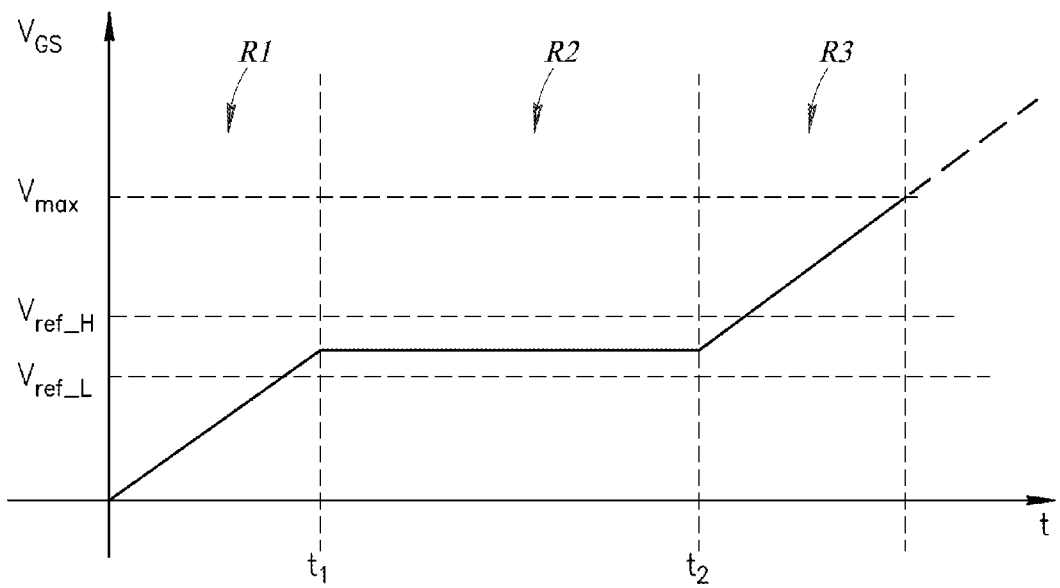
FIG. 4 shows a qualitative representation of a gate charge curve of a typical power MOSFET.
Figure 5:
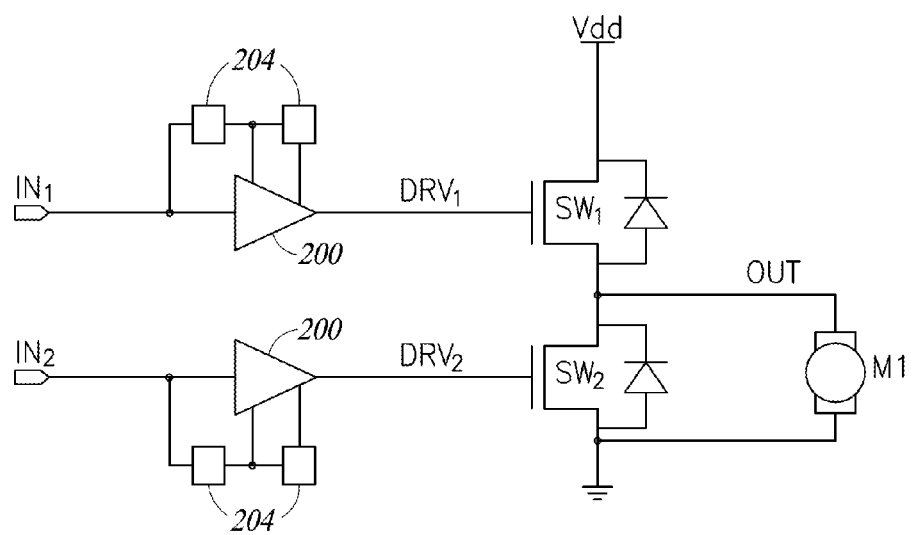
FIG. 5 shows a half-bridge arrangement using a prior-art open loop control.
Figure 6:
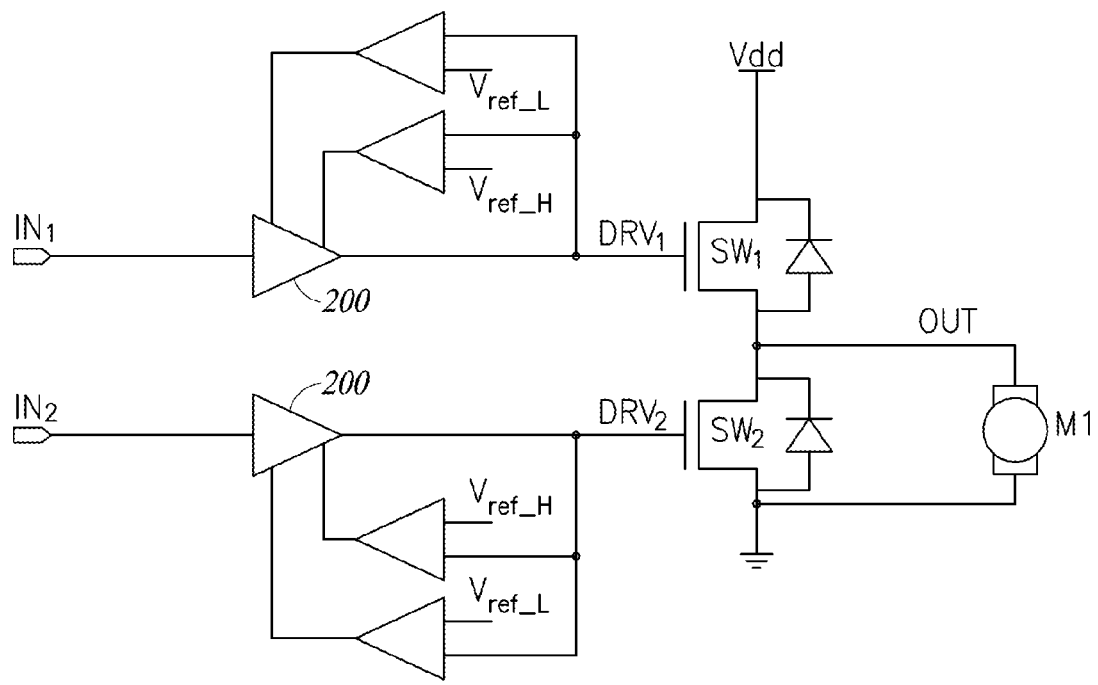
FIG. 6 shows a half-bridge arrangement using a prior-art closed loop control.

As mentioned in the foregoing, the present disclosure relates to a driver 300 for a power MOSFET to be used, e.g., in a half-bridge arrangement as shown in FIGS. 1 to 3. For this purpose, the driver 300 receives at input a control signal IN and provides at output a respective drive signal DRV to be applied to the gate of a power MOSFET SW, such as an n-channel power MOSFET (see also FIG. 8).

As mentioned in the foregoing, the driver 300 should be able to drive the various switch-on and switch-off phases correctly in order to take into account the various regions R1-R3 of a power MOSFET SW.

Figure 7:
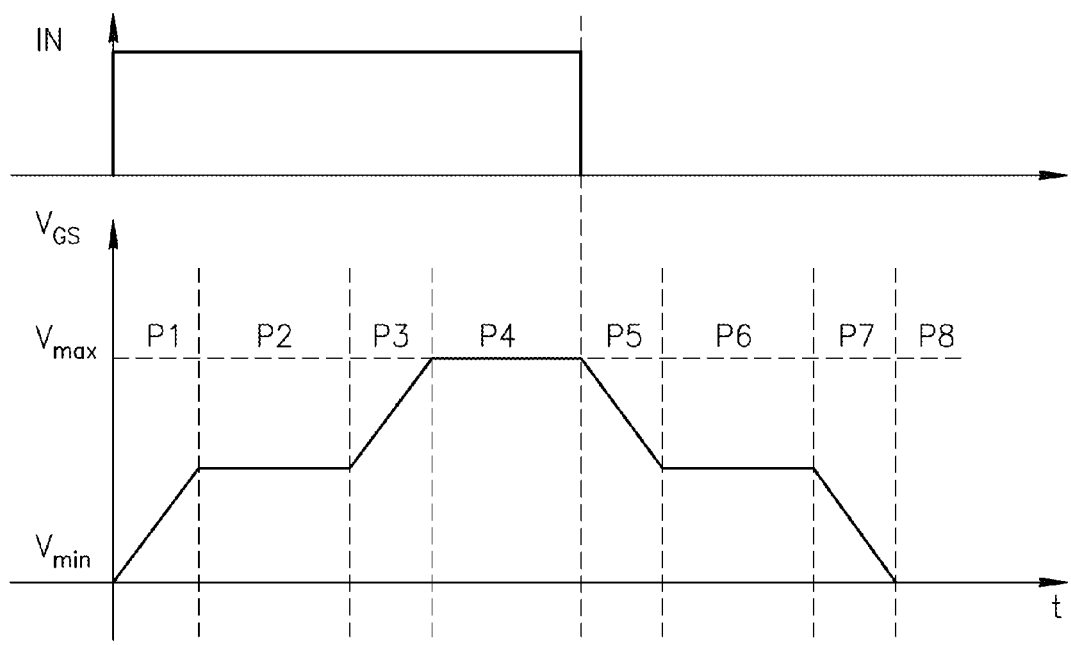
FIG. 7 shows an embodiment of the switch-on and switch-off phases of a power MOSFET in accordance with the present disclosure.

FIG. 7 shows in this regard, an example of a control signal IN and a possible waveform of the gate-source voltage $V_{GS}$ of the power MOSFET SW.

In the example considered, the control signal IN is a binary signal, preferably a signal being set either to a constant non-zero voltage (high) or a zero voltage (low).

In the embodiment considered, when the driver 300 detects that the signal IN changes to high, the driver 300 manages three phase P1, P2 and P3 which respectively manage the regions R1, R2 and R3 of the gate-source voltage $V_{GS}$ of the power MOSFET SW during a switch-on, i.e.:

during the phase P1 the sub threshold region R1 is managed, in which the gate voltage $V_{GS}$ should be increased quickly;

during the phase P2 the saturation region R2 is managed; and during the phase P3 the linear region R3 is managed, in which the gate voltage $V_{GS}$ should be increased quickly in order to reach the minimum switch-on resistance $R_{on}$ condition.

During a following phase P4, the gate-source voltage $V_{GS}$ remains substantially stable at a maximum voltage $V_{max}$ (usually substantially Vdd) until the driver 300 detects that the signal IN changes to low.

In the embodiment considered, the driver 300 manages three further phases P5, P6 and P7 being substantially complementary to the phases P1, P2 and P3 and which respectively manage the regions R1, R2 and R3 of the gate-source voltage of the power MOSFET SW during a switch off, i.e.:

during the phase P5 the linear region R3 is managed, in which the gate voltage $V_{GS}$ should be decreased quickly in order to reach the saturation region R2;

during the phase P6 the saturation region R2 is managed; and during the phase P7 the sub threshold region R1 is managed, in which the gate voltage $V_{GS}$ should be decreased quickly.

Similarly, during a following phase P8, the gate-source voltage $V_{GS}$ remains substantially stable at a minimum voltage (usually substantially zero) until the driver 300 detects that the signal IN changes again to high and the phases P1-P3 are repeated.

Figure 8:
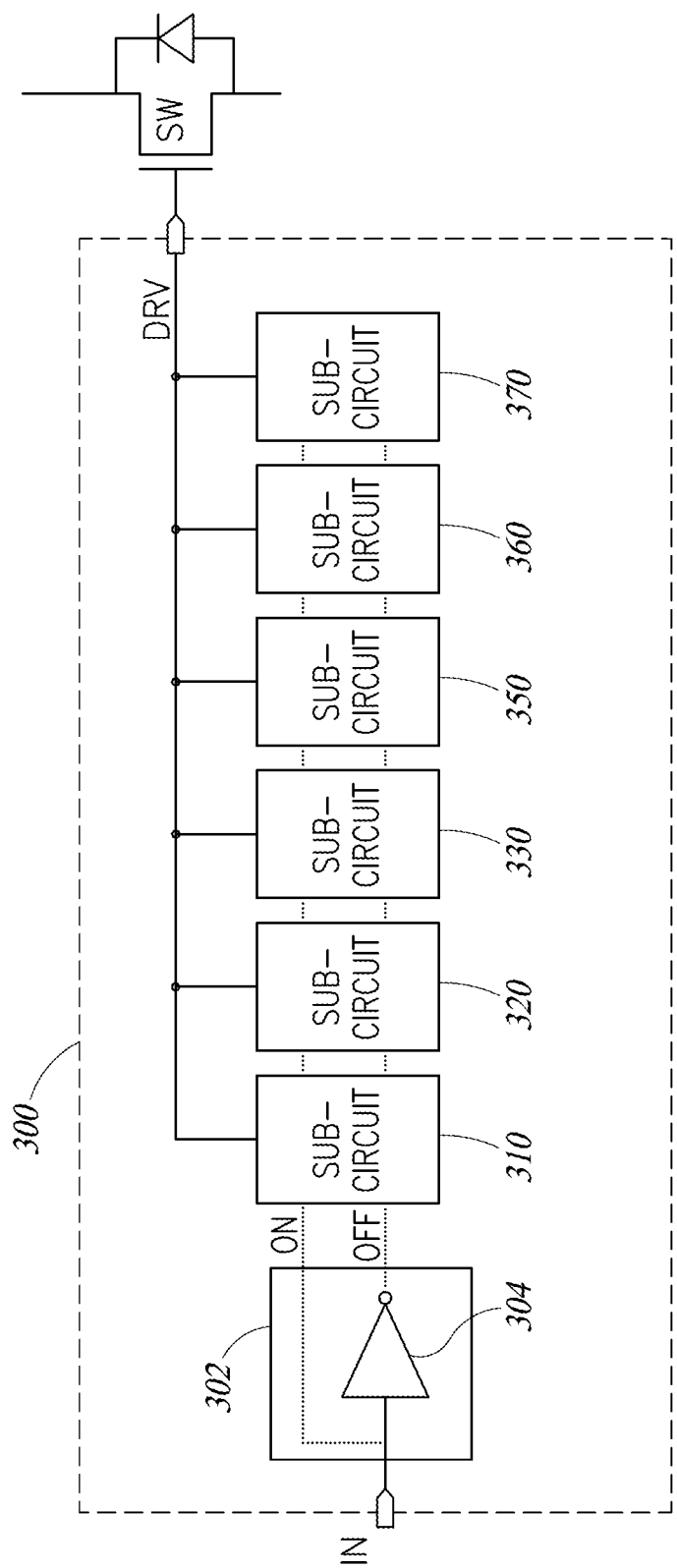
FIG. 8 shows an embodiment of a driver comprising various sub-circuits adapted to drive the various phases shown in FIG. 7.

FIG. 8 shows a first embodiment of a driver 300 in accordance with the present disclosure.

Specifically, in the embodiment considered, the driver 300 comprising various sub-circuits 310, 320, 330, 350, 360 and 370, wherein each sub-circuit is adapted to generate the drive signal DRV during a respective phase shown in FIG. 7.

Accordingly, in the embodiment considered, a dedicated circuit is used for each phase P1-P3 and P5-P7. However, while the prior art solutions used an external control signal (obtained in a feedforward or feedback manner), in various embodiments, the sub-circuits 310, 320, 330, 350, 360 and 370 are able to automatically detect the right moment in which to take the control of the gate of the switch SW, and at the end of the phase automatically turn off, preferably with an almost zero delay.

In various embodiments, the driver 300 comprises moreover a circuit 302 configured to generate two signals, a first signal ON indicating whether the drive signal DRV should switch on the power MOSFET SW, and a second signal OFF indicating whether the drive signal DRV should switch off the power MOSFET SW. For example, based on the exemplary logic levels used for the signal IN, the signal ON may correspond to the signal IN and the signal OFF may correspond to an inverted version of the signal IN. For example, in FIG. 8 is used for this purpose an inverter 304. Generally, this circuit 302 is optional, because the signals ON and OFF may also be generated externally (see, e.g., FIG. 1) and provided to the driver 300.

Figure 9:
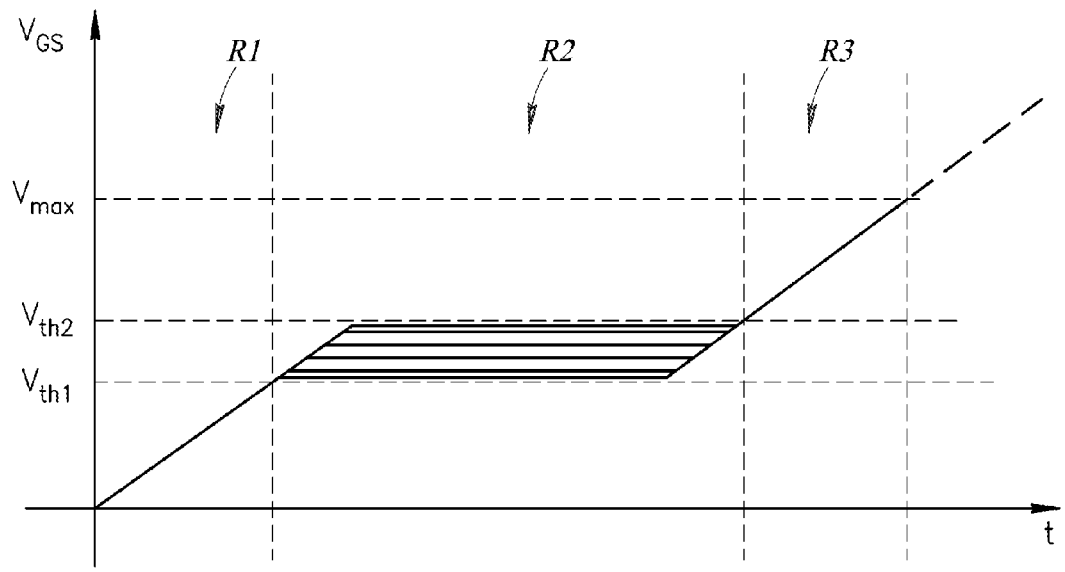
FIG. 9 shows an embodiment for detecting the boundaries between the various regions of the gate charge curve of a typical power MOSFET.

As shown in FIG. 9, in various embodiments, the discrimination of the different phases is accomplished by using two reference voltages $V_{th1}$ and $V_{th2}$ that track process and temperature variations in order to have the benefits of a closed loop control. Moreover, the way in which these reference voltages $V_{th1}$ and $V_{th2}$ are used allows avoiding the use of comparators, thereby removing all related delays and permitting a faster control.

Figure 10:
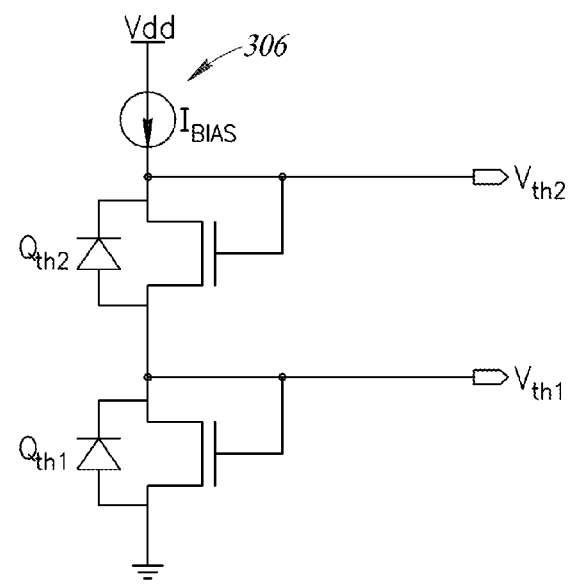
FIGS. 10 to 16 show possible embodiments of the sub-circuits shown in FIG. 8.

FIG. 10 generally shows an embodiment of a circuit adapted to generate two reference voltages $V_{th1}$ and $V_{th2}$.

In the embodiment considered, the circuit comprises two n-channel MOSFET transistors $Q_{th1}$ and $Q_{th2}$ connected in series. Preferably, the transistors $Q_{th1}$ and $Q_{th2}$ are diode connected and/or enhancement mode MOSFETs. Generally, with "diode connected" is meant that the gate of the transistor is directly connected to the drain of the same transistor. In this configuration the transistor is always on, and operating in saturation region.

Specifically, the source of the transistors $Q_{th1}$ is connected to ground GND, the drain of the transistors $Q_{th1}$ is connected to the source of the transistors $Q_{th2}$ and the drain of the transistors $Q_{th2}$ is connected to a bias circuit 306 providing a bias current $I_{BIAS}$. For example, in the embodiment considered, the bias circuit 306, such as a resistor or preferably a constant current source, is connected between the supply voltage Vdd and the drain of the transistors $Q_{th2}$.

In the embodiment considered, each transistor $Q_{th1}/Q_{th2}$ has a negative feedback of the drain voltage, i.e., the drain of each of the transistor $Q_{th1}$ and $Q_{th2}$ is connected (e.g., directly) to the gate of the respective transistor $Q_{th1}$ and $Q_{th2}$. Accordingly, in the embodiment considered, each transistor $Q_{th1}$ and $Q_{th2}$ will adapt the respective gate-source voltage $V_{GS}$, such that the drain current corresponds to the bias current $I_{BIAS}$. Accordingly, the transistors $Q_{th1}$ and $Q_{th2}$ are switched on and the voltage (with respect to ground GND) at the drain of the transistor $Q_{th1}$ corresponds to a first threshold voltage $V_{th1}$ (corresponding substantially to the threshold voltage of the transistor $Q_{th1}$) and the voltage (with respect to ground GND) at the drain of the transistor $Q_{th2}$ corresponds to a second (higher) threshold voltage $V_{th2}$ (corresponding substantially to the sum of the threshold voltages of the transistor $Q_{th1}$ and $Q_{th2}$).

Accordingly, after a start-up transition, the drain voltages $V_{GS}$ of the transistors $Q_{th1}$ and $Q_{th2}$ are constant and may be used as threshold voltages $V_{th1}$ and $V_{th2}$. Moreover, the threshold voltages $V_{th1}$ and $V_{th2}$ may be used to define the saturation region of a power MOSFET, as shown in FIG. 9, and can thus be used for the discrimination of the gate-source voltage range of the power MOSFET. For example, in various embodiments, the threshold voltages of the transistors may be between 0.8 and 1 V, and accordingly the threshold voltage $V_{th1}$ may be in the same range and the threshold voltage $V_{th2}$ may be between 1.6 and 2 V ($V_{th2}=2*V_{th1}$).

In various embodiments, the distance between the two thresholds ($V_{th2}-V_{th1}$, corresponding to the threshold voltage of the transistor $Q_{th2}$), may thus be sufficiently great to include the variations of the saturation region voltage based on different current levels flowing through the load, such as the motor $M_1$. In fact, the saturation region voltage of the power MOSFET SW varies as a function of the current flowing into the power MOSFET SW. However, the range between the threshold voltage ($V_{th2}-V_{th1}$) comprises a wide range of saturation regions (between 0.8 and 1 V), corresponding to a wide range of current values being supported.

Moreover, the inventor has observed that the voltages $V_{th1}$ and $V_{th2}$ may follow substantially process and temperature variations of the power MOSFET SW in case the transistors $Q_{th1}$ and $Q_{th2}$ are realized as a scaled copy of the power MOSFET SW driven by the driver 300.

Figure 11:
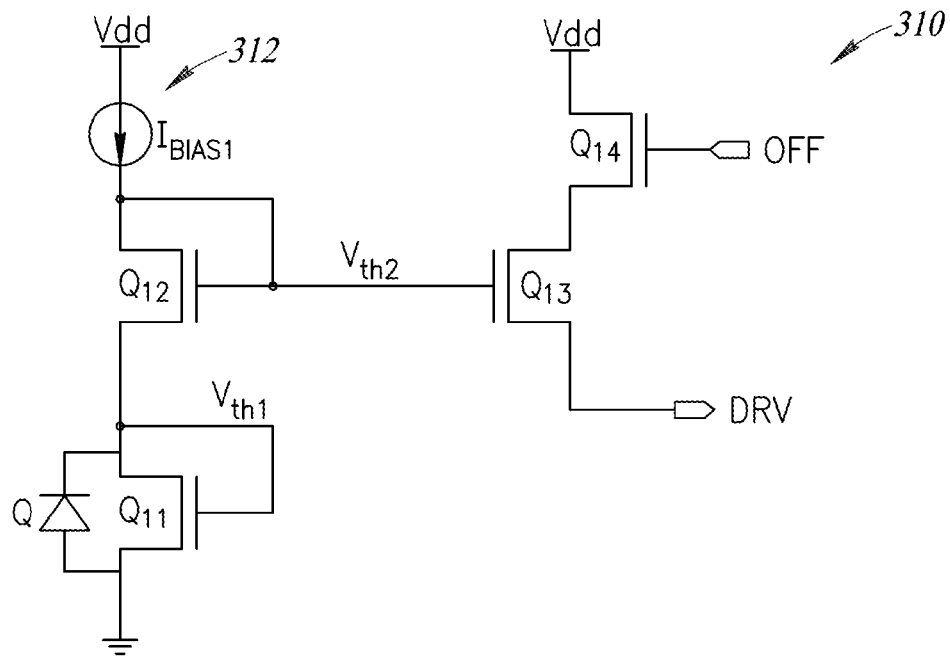

FIG. 11 shows an embodiment of the circuit 310 used to control the phase P1. Specifically, this circuit should increase (quickly) the gate-source voltage $V_{GS}$ of the power MOSFET SW until the gate-source voltage of the power MOSFET reaches the threshold voltage $V_{th1}$.

In the embodiment considered, the sub-circuit 310 comprises for this reason a first diode connected n-channel MOSFET $Q_{11}$ having a configuration as the transistor $Q_{th1}$ in FIG. 10, i.e., the source is connected (e.g., directly) to ground GND and the drain is connected (e.g., directly) to the gate of the transistor $Q_{11}$.

Also in this case, the drain current of the transistor $Q_{11}$ is provided by a bias circuit 312, such as a resistor or constant current generator generating a bias current $I_{BIAS1}$, connected between the supply voltage Vdd and the drain of the transistor $Q_{11}$.

As described in the foregoing, the gate-source voltage $V_{GS}$ (and thus also to drain-source voltage) of the transistor $Q_{11}$ will thus correspond to a first threshold voltage $V_{th1}$. As mentioned in the foregoing, preferably the transistor $Q_{11}$ corresponds to a scaled version of the power MOSFET SW to be driven by the driver 300.

In the embodiment considered, the circuit 310 comprises moreover a voltage follower which provides current through the output DRV of the driver 300 until the respective output voltage $V_{DRV}$ (corresponding to the gate-source voltage of the power MOSFET SW) reaches the voltage $V_{th1}$. Specifically, in the embodiment considered, this is obtained through a voltage mirror comprising two n-channel MOSFET $Q_{12}$ and $Q_{13}$ configured to apply the drain voltage of the transistor $Q_{11}$ also to the output DRV.

Specifically, in the embodiment considered, the source of the transistor $Q_{12}$ is connected (e.g., directly) to the drain of the transistor $Q_{11}$, the drain of the transistor $Q_{12}$ is connected (e.g., directly) via the bias circuit 312 to the supply voltage Vdd and the gate of the transistor $Q_{12}$ is connected (e.g., directly) to the drain of the transistor $Q_{12}$. Moreover, the source of the transistor $Q_{13}$ is connected (e.g., directly) to the output DRV of the driver 300, the drain of the transistor $Q_{13}$ is connected to the supply voltage Vdd and the gate of the transistor $Q_{13}$ is connected (e.g., directly) to the gate of the transistor $Q_{12}$.

Thus, the transistor $Q_{13}$ will tend to apply the same drain-source voltage of transistor $Q_{11}$ to the output DRV. In case the power MOSFET SW is connected to the output DRV, the output voltage $V_{DRV}$ increases and once the gate-source voltage of the transistor $Q_{13}$ falls below the threshold voltage $V_t$ of the transistor $Q_{13}$, the transistor $Q_{13}$ is switched off. The series of transistors $Q_{11}$ and $Q_{12}$ remains on since the current $I_{BIAS1}$ provided by the generator 312 is not changed, but the current provided by the transistor $Q_{13}$ decreases to zero while the output voltage $V_{DRV}$ approaches the threshold $V_{th1}$.

In various embodiments, the circuit 310 is enabled when the power MOSFET SW should be switched on, i.e., when the signal ON is high and the signal OFF is low. For example, this is achieved by means of a further electronic switch $Q_{14}$ driven by the signal ON or the signal OFF. Specifically, in the example considered a p-channel MOSFET $Q_{14}$ is connected (e.g., directly) between the supply voltage Vdd and the drain of the transistor $Q_{13}$ and the gate of the transistor $Q_{14}$ is driven by the signal OFF, i.e., the transistor $Q_{14}$ is conductive only when the signal OFF is low.

Figure 12:
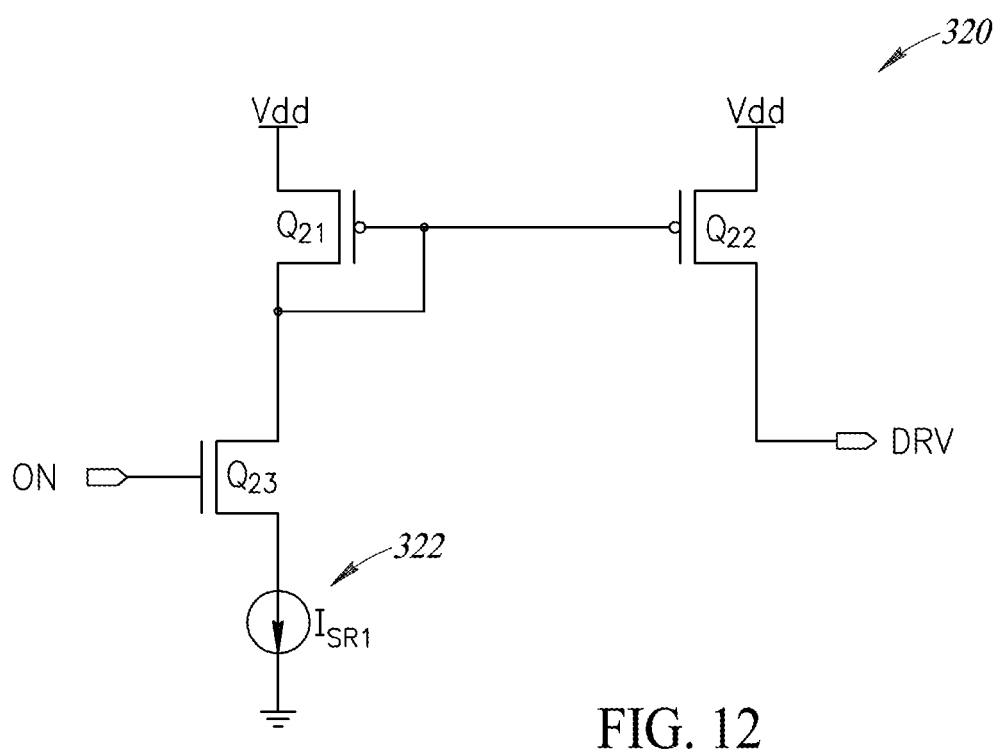

FIG. 12 shows a possible embodiment of the circuit 320. Specifically, during the second phase, the gate of the power MOSFET SW should be driven with a substantially constant current, thereby achieving a constant slope at the half-bridge output.

Generally, any suitable current generator, which may be enabled selectively, may thus be used for the circuit 320.

For example, FIG. 12 shows an embodiment, in which a current source 322, such as a resistor or a constant current generator, is used to generate a current $I_{SR1}$. For example, in the embodiment considered, the current source 322 is connected between the supply voltage Vdd and ground GND.

In the embodiment considered, the circuit 320 comprises moreover a current mirror comprising two p-channel MOSFET transistors $Q_{21}$ and $Q_{22}$ configured to provide the current generated by the current source 322 also to the output DRV. Specifically, in the embodiment considered, the source of the transistor $Q_{21}$ is connected (e.g., directly) to the supply voltage Vdd, the drain of the transistor $Q_{21}$ is connected to the current source 322 and the gate of the transistor $Q_{21}$ is connected (e.g., directly) to the drain of the transistor $Q_{21}$. Moreover, the source of the transistor $Q_{22}$ is connected (e.g., directly) to the supply voltage Vdd, the drain of the transistor $Q_{22}$ is connected (e.g., directly) to the output DRV of the driver 300 and the gate of the transistor $Q_{22}$ is connected (e.g., directly) to the gate of the transistor $Q_{21}$.

In the embodiment considered, the transistor $Q_{22}$ will thus provide current until the voltage $V_{DRV}$ at the output DRV reaches a given maximum voltage and the transistor $Q_{22}$ is switched off.

In various embodiments, the current provided by the circuit 320 is significantly smaller than the current provided by the circuit 330 used for the third phase P3. For example, in various embodiments, the peak current provided by the circuit 330 may be in the range of tens of mA (e.g., between 10 and 100 mA). Conversely, the current $I_{SR1}$ that represents the output current of the transistor $Q_{22}$ may be in the range of hundreds of µA (e.g., between 100 and 500 µA). Accordingly, the circuit 320 may remain switched on in parallel with the circuit 330 and may be switched off automatically when the maximum voltage is reached.

Similarly, in various embodiments, the current provided by the circuit 320 is significantly smaller than the current provided by the circuits 310 used for the first phase P1. For example, in various embodiments, the peak current provided by the transistor $Q_{13}$ may be in the range of mA (e.g., between 1 and 10 mA). Accordingly, the circuit 320, in particular the current mirror, may be switched on already at the beginning of the first phase P1, i.e., when the signal ON goes to high or the signal OFF goes to low.

For example, in the embodiment considered, the circuit 320 comprises for this reason a further electronic switch $Q_{23}$ connected in series with the current source 322. Specifically, in the embodiment considered, the switch $Q_{23}$ is connected between the drain of the transistor $Q_{21}$ and the current source 322. For example, the switch $Q_{23}$ may be an n-channel MOSFET driven by means of the signal ON.

Figure 13:
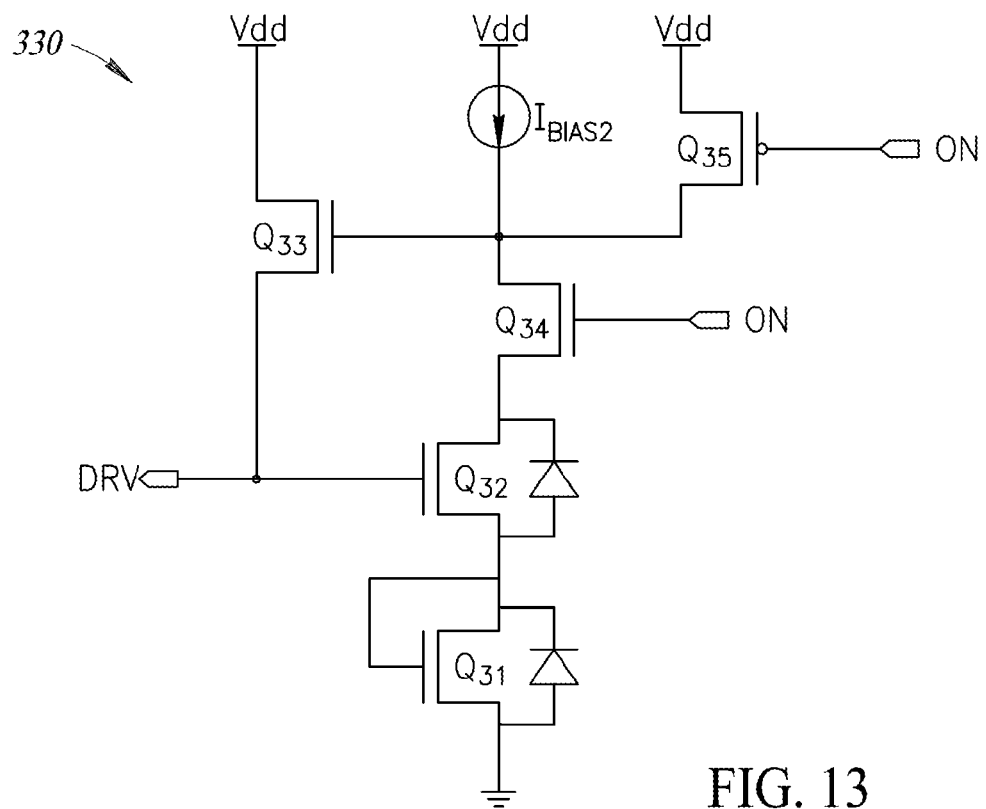

FIG. 13 shows an embodiment of the circuit 330 used to control the phase P3. Specifically, this circuit should increase (quickly) the gate-source voltage $V_{GS}$ of the power MOSFET once the gate-source voltage of the power MOSFET exceeds the threshold voltage $V_{th2}$. In fact, when the gate-source voltage, i.e., the output voltage $V_{DRV}$, increases above the threshold voltage $V_{th2}$, the transition of the output node OUT of the half-bridge has ended and it is possible to boost the gate of the power MOSFET SW, thereby quickly reaching the region with minimum $R_{on}$.

In the embodiment considered, the circuit 330 comprises two n-channel MOSFETs $Q_{31}$ and $Q_{32}$ and a bias current source 332, such as a resistor or a constant current generator. Specifically, in the embodiment considered, the source of the transistor $Q_{31}$ is connected (e.g., directly) to ground GND, the gate of the transistor $Q_{31}$ is connected (e.g., directly) to the drain of the transistor $Q_{31}$. Moreover, the source of the transistor $Q_{32}$ is connected (e.g., directly) to the drain of the transistor $Q_{31}$, the drain of the transistor $Q_{32}$ is connected to the current source 332 through electronic switch $Q_{34}$ (discussed in more detail below), and the gate of the transistor $Q_{32}$ is connected (e.g., directly) to the output DRV.

Accordingly, in the embodiment considered, when the voltage $V_{DRV}$ reaches a given threshold value $V_{th2}$ (corresponding to the sum of the threshold voltages of the transistors $Q_{31}$ and $Q_{32}$) the transistors $Q_{31}$ and $Q_{32}$ are switched on.

In the embodiment considered, these switched-on transistors $Q_{31}$ and $Q_{32}$ are used to connect the output DRV to the supply voltage Vdd. For example, in the embodiment considered, a p-channel MOSFET $Q_{33}$ is used for this purpose. Specifically, the source of the transistor $Q_{33}$ is connected (e.g., directly) to the supply voltage Vdd, the drain of the transistor $Q_{33}$ is connected (e.g., directly) to the output DRV and the gate of the transistor $Q_{33}$ is connected to the drain of the transistor $Q_{32}$ through electronic switch $Q_{34}$. Accordingly, when the transistors $Q_{31}$ and $Q_{32}$ are switched on, the gate of the transistor $Q_{33}$ will be pulled down, thereby switching on the transistor $Q_{33}$.

Generally, the circuit 330 should only be enabled when the signal ON is high or the signal OFF is low. In fact, the circuit 330 may already be enabled during the phase P1, because the circuit 330 will be activated automatically only when the output voltage $V_{DRV}$ exceeds the threshold voltage $V_{th2}$.

In the embodiment considered, the circuit 330 comprises for this reason an electronic switch $Q_{34}$ connected in series with at least one of: the transistors $Q_{31}/Q_{32}$ or the current bias current source 332. For example, in the embodiment considered, the electronic switch $Q_{34}$, such as a n-channel MOSFET, is connected between the drain of the transistor $Q_{32}$ and the bias current source 332. Specifically, in the embodiment considered, the source of the transistor $Q_{34}$ is connected (e.g., directly) to the drain of the transistor $Q_{32}$, the drain of the transistor $Q_{34}$ is connected (e.g., directly) to the bias current source 332, i.e., the gate of the transistor $Q_{33}$, and the gate of the transistor $Q_{34}$ is connected to the signal ON.

In various embodiments, the circuit 330 may also comprise a further electronic switch $Q_{35}$ which connects the gate of the transistor $Q_{33}$ to the supply voltage when the signal ON is low or the signal OFF is high, thereby reliably maintaining the transistor $Q_{33}$ opened during the phases P5-P8.

For example, in the embodiment considered, the switch $Q_{35}$ is implemented with a p-channel MOSFET. Specifically, in the embodiment considered, the source of the transistor $Q_{35}$ is connected (e.g., directly) to the supply voltage Vdd, the drain of the transistor $Q_{35}$ is connected (e.g., directly) to the gate of the transistor $Q_{33}$ and the gate of the transistor $Q_{35}$ is connected to the signal ON.

Accordingly, in the solutions described in the foregoing, the circuit 310, 320 and 330 are enabled during the phase P1, i.e., when the signal ON goes to high/the signal OFF goes to low. Moreover, the circuit 310 stops supplying current through the output DRV when the output voltage $V_{DRV}$ reaches the threshold voltage $V_{th1}$. Conversely, the circuit 330 connects the output DRV to the supply voltage Vdd when the output voltage $V_{DRV}$ exceeds the threshold voltage $V_{th2}$. Finally, the circuit 320 provides during the phases P1-P3 a current, which however may be neglected during the phases P1 and P3.

Figure 14:
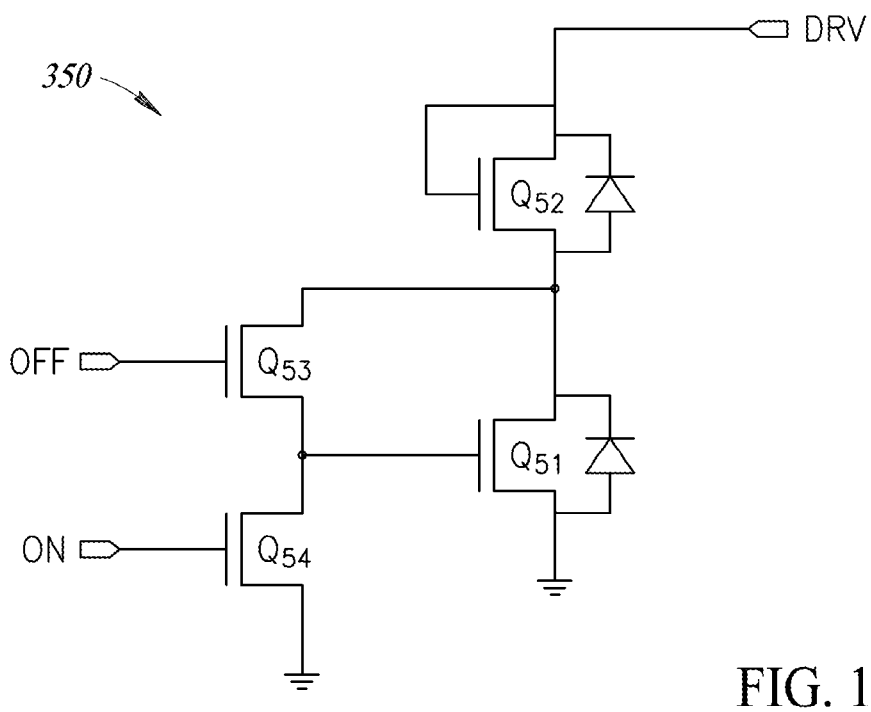

FIG. 14 shows an embodiment of the circuit 350 used to control the phase P5. Specifically, this circuit should decrease the gate-source voltage $V_{GS}$ of the power MOSFET until the gate-source voltage of the power MOSFET reaches the threshold voltage $V_{th2}$. Specifically, when the power MOSFET has to be turned off, the phase P5 should be passed as quickly as possible because it represents a delay of the actuation of PWM command at the output node of half bridge.

In the embodiment considered are used again two n-channel MOSFET $Q_{51}$ and $Q_{52}$, which are connected in series. Specifically, in the embodiment considered, the source of the transistor $Q_{51}$ is connected (e.g., directly) to ground GND, the drain of the transistor $Q_{51}$ is connected (e.g., directly) to the source of the transistor $Q_{52}$ and the drain of the transistor $Q_{52}$ is connected (e.g., directly) to the output DRV.

In the embodiment considered, the transistors $Q_{51}$ and $Q_{52}$ are configured such that they reflect the configuration shown in FIG. 10 when the signal OFF is high (and the signal ON is low).

For this purpose, the gate of one of the transistors $Q_{51}$ and $Q_{52}$ may by connected (e.g., directly) to the own drain. For example, in FIG. 14, the gate of the transistor $Q_{52}$ is connected (e.g., directly) to the drain of the transistor $Q_{52}$. Conversely, the gate of the other of the transistors $Q_{51}$ and $Q_{52}$ may by connected selectively to the own drain by means of a further electronic switch $Q_{53}$, such as a n-channel MOSFET. For example, in FIG. 14, the gate of the transistor $Q_{51}$ is connected (e.g., directly) to the source of the transistor $Q_{53}$ and the drain of the transistor $Q_{51}$ is connected (e.g., directly) to the drain of the transistor $Q_{53}$. Finally, the gate of the transistor $Q_{53}$ is connected to the signal OFF.

Accordingly, in the embodiment considered, when the transistor $Q_{53}$ is turned on by signal OFF, the gate of transistor $Q_{51}$ is short circuited to the drain of transistor $Q_{51}$ and the gate-source voltage of $Q_{51}$ equals $V_{th1}$. Accordingly, the output voltage $V_{DRV}$, i.e., the gate voltage of the power MOSFET SW, is quickly discharged. The circuit 350 automatically stops discharging when the output voltage $V_{DRV}$ falls below the threshold voltage $V_{th2}$ (i.e., the sum of the threshold voltages of the transistors $Q_{51}$ and $Q_{52}$), because the transistors $Q_{51}$ and $Q_{52}$ enter the sub-threshold region.

In various embodiments, the circuit 350 may comprise a further electronic switch, which ensures that the circuit 350 is not activated during the phases P1-P4. For example, in the embodiment considered, an electronic switch $Q_{54}$, such as a n-channel MOSFET, is connected between the gate of the transistor $Q_{51}$ and ground GND. Specifically, in the embodiment considered, this electronic switch $Q_{54}$ is driven by the signal ON and ensures that the gate of the transistor $Q_{51}$ is connected to ground, i.e., the transistor $Q_{51}$ is switched off, when the signal ON is high.

Figure 15:
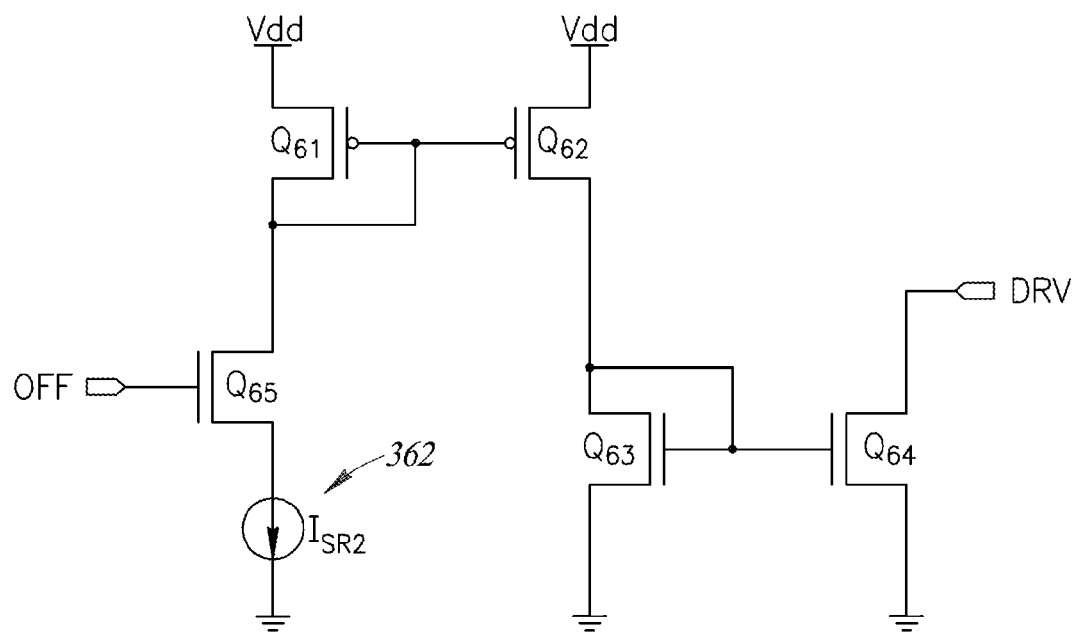

FIG. 15 shows an embodiment of the circuit 360 used to control the phase P6. Specifically, this circuit 360 should discharge the gate of the power MOSFET with a constant current in order to obtain a constant slope of the half-bridge output.

In the embodiment considered, the circuit 360 operates similarly as the circuit 320. Specifically, also in this case, the circuit 360 may be switched on already during the phase P5 and may remain activated during the phases P5-P7. In fact, also in this case, the discharge current of the circuit 360 may be small compared to the current passing through the circuits 350 and 370 (when enabled).

Accordingly, any suitable current generator being selectively enablable may be used for the circuit 360.

For example, in FIG. 15 is used a current generator 362, such as a resistor or constant current generator generating a current $I_{SR2}$. This current $I_{SR2}$ is applied via a current mirror comprising two p-channel MOSFET $Q_{61}$ and $Q_{62}$ to a second branch. Finally, the current in this second branch is then applied by means of a further current mirror comprising two n-channel MOSFET $Q_{63}$ and $Q_{64}$ to the output DRV. Specifically, in the embodiment considered, the transistor $Q_{64}$ is connected between the output DRV and ground GND. Accordingly, the transistors $Q_{61}$ to $Q_{64}$ discharge the output DRV with the current $I_{SR2}$ until the output DRV falls below a given minimum voltage corresponding substantially to zero volt.

As mentioned in the foregoing, the circuit 360 should only be enabled when the signal ON is low or the signal OFF is high. For example, in the embodiment considered, the circuit 360 comprises for this reason a further electronic switch $Q_{65}$, such as a n-channel MOSFET, driven by the signal OFF and connected between the current generator 362 and the first current mirror $Q_{61}/Q_{62}$.

Figure 16:
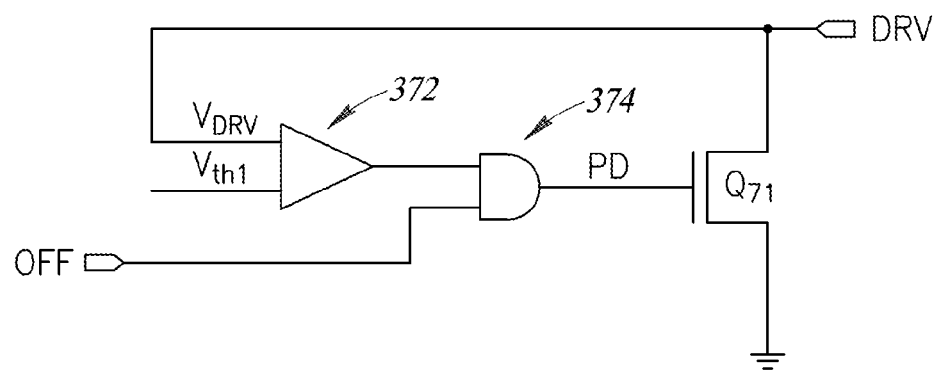

FIG. 16 shows an embodiment of the circuit 370 used to control the phase P7. Specifically, this circuit should decrease (quickly) the output voltage $V_{DRV}$, i.e., the gate voltage of the power MOSFET SW, once the output voltage $V_{DRV}$ falls below the threshold voltage $V_{th1}$.

For example, in the embodiment considered, an electronic switch $Q_{71}$, such as a n-channel MOSFET, is used for this purpose. Specifically, the transistor $Q_{71}$ is connected between the output DRV and ground GND, and represents an active pull-down.

In the embodiment considered, the transistor $Q_{71}$ is controlled as a function of a pull-down control signal PD indicating that the output voltage $V_{DRV}$ is below the threshold $V_{th1}$ and that the signal OFF is high (or the signal ON is low).

For example, in the embodiment considered, the circuit comprises a comparator 372, preferably implemented with MOSFET transistors, configured to determine whether the voltage $V_{th1}$ (which may be obtained, e.g., from the drain of transistor $Q_{11}$ of the circuit 310) is greater than the voltage $V_{DRV}$. Moreover, considering the exemplary logic levels of the signals, an AND gate 374 may be used to generate the signal PD based on the logic values of the signal at the output of the comparator 372 and the signal OFF.

Figure 17:
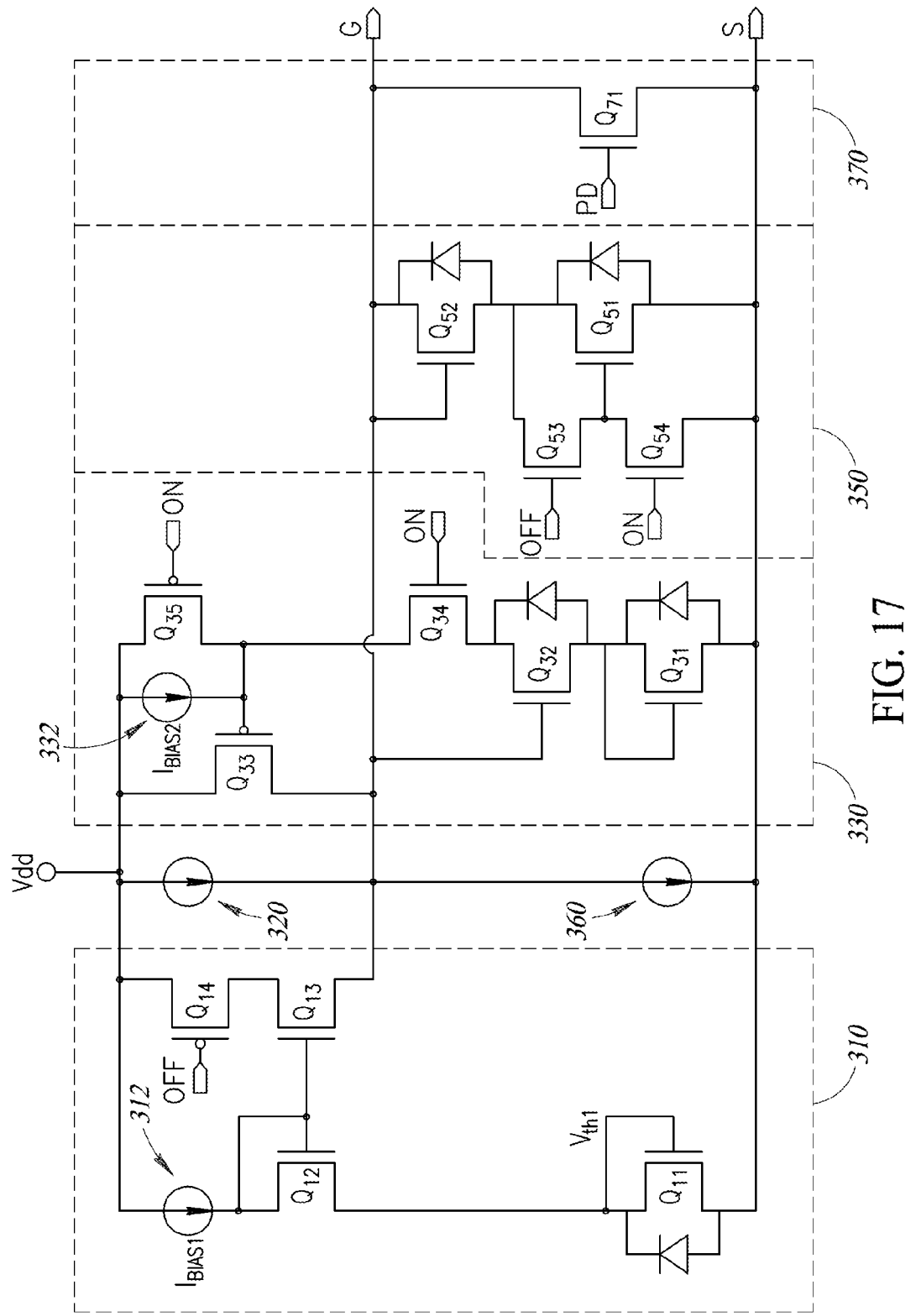
FIG. 17 shows an embodiment of a power MOSFET driver in accordance with the present disclosure.

FIG. 17 shows in this respect a possible embodiment of the complete driver 300, wherein the output DRV of the driver may be connected to the gate G of the power MOSFET SW and the ground GND of the driver 300 may be connected to the source S of the power MOSFET SW.

Apart from the circuit 370 (which might require an additional comparator 372), the other sub-circuits 310, 320, 330, 350 and 360 are enabled/disabled directly based on the signals ON and OFF.

In the embodiments considered, the circuits 310, 320 and 330 are:
enabled when the signal ON is high, i.e., when the signal OFF is low; and
disabled when the signal ON is low, i.e., when the signal OFF is high.

Specifically, in the embodiment considered, the circuit 310 is immediately active when the circuit is enabled (e.g., at the rising edge of the signal ON) and applies a current to the output DRV (i.e., the gate G of the power MOSFET SW) until the output voltage $V_{DRV}$ (i.e., the gate-source voltage $V_{GS}$ of the power MOSFET SW) reaches the first threshold voltage $V_{th1}$, i.e., the circuit 310 is automatically deactivated when the first threshold voltage $V_{th1}$ is reached. In the embodiment considered, this is achieved by generating a reference voltage signal $V_{th1}$ by means of the transistor $Q_{11}$ (and the bias current source 312). In the embodiment considered, a voltage follower arrangement (being, e.g., based on a n-channel MOSFET voltage mirror) is then used to apply current to the driver output until the first threshold voltage $V_{th1}$ is reached.

The circuit 330 is automatically activated once the output voltage $V_{DRV}$ (i.e., the gate-source voltage $V_{GS}$ of the power MOSFET SW) exceeds the second threshold voltage $V_{th2}$. In the embodiment considered, this is achieved by using a series connection of two transistor $Q_{31}$ and $Q_{32}$ (and the bias current source 332), which are switched on when the output voltage $V_{DRV}$ is greater than the second threshold voltage $V_{th2}$ corresponding to the sum of the threshold voltages of the two transistor $Q_{31}$ and $Q_{32}$. When the transistors $Q_{31}$ and $Q_{32}$ are switched on, the output DRV is connected (substantially immediately) to the supply voltage Vdd.

Finally, in the embodiment considered, the circuit 320 is already activated during the first phase, i.e., when the signal ON goes to high, and is automatically deactivated once the output voltage $V_{DRV}$ reaches a given maximum value.

Accordingly, in the embodiments considered, the transistor $Q_{11}$ defines the (deactivation) threshold voltage $V_{th1}$ for the circuit 310 and the transistors $Q_{31}$ and $Q_{32}$ define the (activation) threshold voltage $V_{th2}$ for the circuit 330.

Conversely, in the embodiments considered, the circuits 350, 360 and 370 are:

enabled when the signal OFF is high, i.e., when the signal ON is low; and disabled when the signal OFF is low, i.e., when the signal ON is high.

Specifically, in the embodiment considered, the circuit 350 is immediately active when the circuit is enabled (e.g., at the rising edge of the signal OFF) and applies a negative current to the output DRV (e.g., by short circuiting the terminals G and S) until the output voltage $V_{DRV}$ (i.e., the gate-source voltage $V_{GS}$ of the power MOSFET SW) falls below the second threshold voltage $V_{th2}$, i.e., the circuit 350 is automatically deactivated when the second threshold voltage $V_{th2}$ is reached. In the embodiment considered, this is achieved by using a series connection of two transistor $Q_{51}$ and $Q_{52}$, which are switched off when the output voltage $V_{DRV}$ is smaller than the second threshold voltage $V_{th2}$ corresponding to the sum of the threshold voltages of the two transistor $Q_{51}$ and $Q_{52}$.

The circuit 370 is automatically activated once the output voltage $V_{DRV}$ falls below the first threshold voltage $V_{th1}$. For example, in the embodiment considered, this is achieved by means of a comparator 372 which compares the output voltage VDRV with the first threshold value $V_{th1}$ generated, e.g., by means of the transistor $Q_{11}$ of the circuit 310.

Finally, in the embodiment considered, the circuit 360 is already activated during the phase P5, e.g., when the signal OFF goes to high, and is automatically deactivated once the output voltage $V_{DRV}$ reaches a given minimum value.

Accordingly, in the embodiments considered, the transistors $Q_{51}$ and $Q_{52}$ define the (deactivation) threshold voltage $V_{th2}$ for the circuit 350. Moreover, the transistor $Q_{11}$ may define also the (activation) threshold voltage $V_{th1}$ for the circuit 370.

In various embodiments, in order to ensure that the circuits use the same first threshold $V_{th1}$, the transistors $Q_{11}$, $Q_{31}$ and $Q_{51}$ have the same characteristics, e.g., the same dimensions. Additionally, in order to ensure that the circuits use the same second threshold $V_{th2}$, the transistors $Q_{32}$ and $Q_{52}$ may have the same characteristics, e.g., the same dimensions. In various embodiments, the transistors $Q_{11}$, $Q_{31}$, $Q_{32}$, $Q_{51}$ and $Q_{52}$ may have the same characteristics. For example, the transistors may have the same characteristics by implementing the various transistors with identical dimensions in the same integrated circuit.

In various embodiments, the transistors that define the threshold voltages $V_{th1}$ and $V_{th2}$ for the various sub-circuits, in particular the circuits 310, 330, 350 and/or 370, correspond to scaled versions of the power MOSFET SW driven by the driver, thereby ensuring that the transistors follow the same temperature variation. Moreover, in case the power MOSFET SW is also implemented in the same integrated circuit, the transistors are also subject to the same production tolerances. Generally, also only a subset of the transistors may satisfy this criterion, for example, only the transistors defining the lower threshold voltage $V_{th1}$, i.e., the transistors $Q_{11}$, $Q_{31}$ and $Q_{51}$.

Accordingly, in the embodiments considered, the transistors $Q_{11}$, $Q_{12}$, $Q_{21}$, $Q_{31}$, $Q_{52}$, $Q_{61}$, $Q_{63}$ are diode connected and the transistor $Q_{51}$ is only diode connected when the signal OFF is high and the electronic switch $Q_{53}$ is on. Conversely, the diodes connected between the source and drain of the various transistors ($Q_{th1}$, $Q_{th2}$, $Q_{11}$, $Q_{31}$, $Q_{32}$, $Q_{51}$, $Q_{52}$) shown in the FIGS. 10 to 17 merely highlight that the respective transistor may have the same characteristics as the power MOSFET (see e.g., FIGS. 1, 5, 6, and 7, in which the power MOSFET is represented with its source-drain diode). Such a diode usually corresponds to the body diode of a MOSFET, where the body is short circuited to the source.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the previous embodiments concern MOSFET transistors, the solutions disclosed herein may also be used with other types of field-effect transistors. Moreover, a substantially similar driver, e.g., for the driving of a p-channel power MOSFET, may be obtained by replacing n-channel transistors with p-channel transistors and vice versa.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driver, comprising:
an input terminal for receiving a control signal;
a first and a second output terminal configured to be connected to the gate and the source of a power field-effect transistor, respectively;
a first circuit configured to apply a charge current to said first output terminal when said control signal has a first logic value and the voltage between said first and said second output terminals is smaller than a first reference voltage;

a second circuit configured to apply a charge current to said first output terminal when said control signal has said first logic value and the voltage between said first and said second output terminals is greater than a second reference voltage;

a third circuit configured to apply a discharge current to said first output terminal when said control signal has a second logic value and the voltage between said first and said second output terminals is greater than a third reference voltage;

a fourth circuit configured to apply a discharge current to said first output terminal when said control signal has said second logic value and the voltage between said first and said second output terminals is smaller than a fourth reference voltage; and at least one field-effect transistor configured to generate at least one of said first, second, third or fourth reference voltage, the at least one of said first, second, third or fourth reference voltage being based on at least one threshold voltage of the at least one field-effect transistor, and wherein each of said charge and discharge currents is activated based on a difference between said voltage between the said first and second output terminals and said at least one threshold voltage.

2. The driver according to claim 1 wherein said first circuit comprises:
  a first bias current source configured to generate a first bias current;
  a first field-effect transistor connected in series with said first bias current source, wherein the gate of said first field-effect transistor is connected to the drain of said first field-effect transistor, such that the drain-source voltage of said first field-effect transistor corresponds to the threshold voltage of said first field-effect transistor representing said first reference voltage; and
  a voltage follower arrangement configured to apply a charge current to said first output terminal until the voltage between said first and said second output terminal reaches said first reference voltage.

3. The driver according to claim 2 wherein said voltage follower arrangement comprises a voltage mirror.

4. The driver according to claim 2 wherein said first circuit comprises:
  a first electronic switch configured to selectively enable said first circuit when said control signal has said first logic value.

5. The driver according to claim 1 wherein said second circuit comprises:
  a second bias current source configured to generate a second bias current;
  a second and a third field-effect transistor connected in series with said second bias current source, wherein:
    the gate of said second field-effect transistor is connected to the drain of said second field-effect transistor, such that the drain-source voltage of said second field-effect transistor corresponds to the threshold voltage of said second field-effect transistor, and
    the gate of said third field-effect transistor is connected to said first output terminal, such that said second and said third field-effect transistor are closed when the voltage between said first and said second output terminal is greater than the sum of the threshold voltages of said second and said third field-effect transistor, wherein said sum of the threshold voltages of said second and said third field-effect transistor represents said second reference voltage.

6. The driver according to claim 5 wherein said second circuit comprises:
  an electronic switch configured to connect said output to a supply voltage when said second and said third field-effect transistor are closed.

7. The driver according to claim 5 or wherein said second circuit comprises:
  a second electronic switch configured to selectively enable said second circuit when said control signal has said first logic value.

8. The driver according to claim 1 wherein said third circuit comprises a fourth and a fifth field-effect transistor connected in series between said first and said second output terminal, wherein at least one electronic switch is associated with said fourth and/or said fifth, such that, when said control signal has said second logic value:
  the gate of said fourth field-effect transistor is connected to the drain of said fourth field-effect transistor, such that the drain-source voltage of said fourth field-effect transistor corresponds to the threshold voltage of said fourth field-effect transistor,
  the gate of said fifth field-effect transistor is connected to the drain of said fifth field-effect transistor, such that the drain-source voltage of said fifth field-effect transistor corresponds to the threshold voltage of said fifth field-effect transistor, and
  said fourth and a fifth field-effect transistor are closed when the voltage between said first and said second output terminal is greater than the sum of the threshold voltages of said fourth and said fifth field-effect transistor, wherein said sum of the threshold voltages of said fourth and said fifth field-effect transistor represents said third reference voltage.

9. The driver according to claim 2 wherein:
  said first, said second and said fourth field-effect transistor have the same characteristics, and/or
  said third and said fifth field-effect transistor have the same characteristics.

10. The driver according to claim 9 wherein:
  said first, said second and said fourth field-effect transistor are scaled versions of said power field-effect transistor, and/or
  said third and said fifth field-effect transistor are scaled versions of said power field-effect transistor.

11. The driver of claim 1, wherein the third threshold voltage is equal to the second threshold voltage and the fourth threshold voltage is equal to the first threshold voltage.

12. An electronic system, comprising:
  a first driver including:
    an input configured to receive a control signal;
    a first output node and a second output node;
    a first sub-circuit configured to provide a first charge current to the first output node responsive to the control signal having a first value and a voltage between the first and second output node being less than a first reference;
    a second sub-circuit configured to provide a second charge current to the first output node after the first charge current and responsive to the control having the first value and the voltage between the first and said second output nodes being greater than a second reference;

a third sub-circuit configured to sink a first discharge current from the first output node responsive to the control signal having a second value and the voltage between the first and second output nodes being greater than a third reference; and a fourth sub-circuit configured to sink a second discharge current from the first output node after the first discharge current and responsive to the control signal having the second value and the voltage between the first and second output nodes being less than a fourth reference;

at least one field-effect transistor configured to generate at least one of the first, second, third or fourth reference based on at least one threshold voltage of the at least one field-effect transistor, and wherein each of the charge and discharge currents is activated based on a difference between the voltage between the first and second output terminals and the at least one threshold voltage; and a first power field-effect transistor having a gate coupled to the first output node and a source coupled to the second output node of the first driver.

13. The electronic system according to claim 12 further comprising a second driver and a second power field-effect transistor coupled to the second driver, wherein the first and second power field-effect transistor are arranged as a half-bridge circuit.

14. The electronic system of claim 13, wherein the first and second drivers and the first and second power field-effect transistors are formed in the same integrated circuit.

15. The electronic system of claim 14, wherein selected ones of the transistors in the first and second drivers are scaled versions of the first and second power field-effect transistors.

16. The electronic system of claim 12 further comprising:
a fifth sub-circuit configured to provide a charge current to the first output node responsive to the control having the first value and the voltage between the first and second output nodes being greater than the first threshold and less than the second threshold; and
a sixth sub-circuit configure to sink a discharge current from the first output node responsive to the control having the second value and the voltage between the first and second output nodes being less than the third threshold and greater than the fourth threshold.

17. A power field-effect transistor driver comprising an input node configured to receive a control signal and first and second output nodes configured to be coupled to a control node and a signal node, respectively, of a power field-effect transistor, the power field-effect transistor driver including at least one field-effect transistor configured to generate at least one of a first reference voltage and a second reference voltage that is greater than the first threshold voltage, and the power transistor driver being further configured, to turn on the power field-effect transistor, to provide a first charge current to the first output node responsive to the control signal having a first value and a voltage between the first and second output nodes being less than the first reference voltage, where the first charge current is provided based on a difference between the voltage between the first and second output nodes and a threshold voltage of a first field-effect transistor, and the power transistor driver further configured to provide a second charge current to the first output node responsive to the control signal having the first value and the voltage between the first and second output nodes being greater than the second reference voltage, where the second charge current is provided based on a difference between the voltage between the first and second output nodes and a threshold voltage of a second field-effect transistor.

18. The power field-effect transistor driver of claim 17, wherein the power field-effect driver is further configured, to turn off the power field-effect transistor, to discharge a first discharge current from the first output node responsive to the control signal having a second value and the voltage between the first and second output nodes being greater than a third reference voltage, the first discharge current being provided based on a difference between the voltage between the first and second output nodes and a threshold voltage of a third field-effect transistor, and the power field-effect transistor driver further configured to discharge a second discharge current from the first output node responsive to the control signal having the second value and the voltage between the first and second output node being less than a fourth reference voltage, the second discharge current being provided based on a difference between the voltage between the first and second output node and a threshold voltage of a fourth field-effect transistor.

19. The power field-effect transistor driver of claim 17, wherein each of the field-effect transistors comprises a diode-coupled MOS transistor.

20. The power field-effect transistor driver of claim 17, wherein the control signal comprises a digital signal and the first and second values correspond to first and second logic values, respectively.

21. The power field-effect transistor driver of claim 17, wherein each of the field-effect transistors is a field-effect transistor that is a scaled version of the power field-effect transistor.

* * * * *